United States Patent [19]

McIver et al.

[11] 4,396,936

[45] Aug. 2, 1983

[54] INTEGRATED CIRCUIT CHIP PACKAGE WITH IMPROVED COOLING MEANS

[75] Inventors: Chandler H. McIver, Tempe; Richard J. Banach, Phoenix, both of Ariz.

[73] Assignee: Honeywell Information Systems, Inc., Phoenix, Ariz.

[21] Appl. No.: 221,104

[22] Filed: Dec. 29, 1980

[51] Int. Cl.³ .................... H01L 23/02; H01L 23/28; H01L 39/02
[52] U.S. Cl. ....................................... 357/81; 357/72; 357/80; 174/52 PE
[58] Field of Search .................... 357/81, 69, 74, 72; 174/52 PE

[56] References Cited

U.S. PATENT DOCUMENTS 3,296,501 11/1962 Moore .................................. 357/81
3,594,619 7/1971 Kamoshida et al. .................. 357/69

FOREIGN PATENT DOCUMENTS 2742882 4/1979 Fed. Rep. of Germany .... 357/81 C

OTHER PUBLICATIONS

"Microcircuit Heat Sink", G. B. Cherniak et al., *IBM Technical Disclosure Bulletin*, vol. 8, No. 10, Mar. 1966, p. 1457.
"Multilayer Module", W. Fedrowitz et al., *IBM Technical Disclosure Bulletin*, vol. 20, No. 12, May 1978, pp. 5172–5174.
"Stacked Thermally Enhanced High Package Density Module", R. Marks et al., *IBM Technical Disclosure Bulletin*, vol. 23, No. 11, Apr. 1981, p. 4835.

*Primary Examiner*—Andrew J. James
*Assistant Examiner*—Elizabeth D. Burnside
*Attorney, Agent, or Firm*—E. W. Hughes; W. W. Holloway, Jr.; L. J. Marhoefer

[57] ABSTRACT

An integrated circuit package in which an integrated circuit chip having flexible beam leads, the inner lead bonding sites of which are bonded to input and output terminals on the active face of the chip, is mounted active face down on the top surface of a substrate. The top surface of the substrate is provided with a chip pad on which the integrated circuit chip is mounted and outer lead pads. The back surface of the substrate has a heat sink pad which is positioned substantially opposite the chip pad. A plurality of thermal passages is formed through the substrate interconnecting the chip pad and the heat sink pad. A good thermally conductive material fills the passages. A preform comprising a segment of fiber glass web coated with a thermosetting and thermally conductive plastic is positioned on each chip pad between the chip pad and the active face of the integrated circuit chip. The plastic material of the preform encapsulates the active face of the chip, including a portion of each of the leads proximate the chip and secures the chip to the chip pad. The outer lead bonding sites of the leads are bonded to outer lead pads of the substrate with exposed portions of the leads between the outer lead pads and the encapsulated portions being bent away from the substrate and under compression. A heat sink is bonded to the heat sink pad. The plastic material of the preform, the chip pad and the thermally conductive material filling the thermal passages provide a low impedance thermal path between the integrated circuit chip and the heat sink.

15 Claims, 2 Drawing Figures

INTEGRATED CIRCUIT CHIP PACKAGE WITH IMPROVED COOLING MEANS

BACKGROUND OF THE INVENTION

1. Field of the Invention

This invention is in the field of integrated circuit chip packages and more particularly relates to the field of an integrated circuit chip package which is provided with improved means for cooling the chip.

2. Description of the Prior Art

Integrated circuit chips, or dies, are generally packaged as either discrete devices, one chip per package, or as part of a multichip hybrid circuit or a hybrid package. With the degree of integration of chips increasing with time, discrete packages of large-scale integrated circuit chips required a substrate which can provide the necessary number of interconnections so that the package comprising a chip and the circuitry of the substrate can become a significant building block of complex electronic circuits. A development with respect to mounting chips on packages and particularly one that lends itself to automating the process of packaging large-scale integrated circuit chips involves producing a flexible beam lead frame which is laminated to a strip of thin plastic material, such as standard 35 mm film. The input and output terminals on the active face of a chip are bonded to inner lead bonding sites of the leads of a given lead frame. The prior art teaches mounting such an integrated circuit chip on a substrate such as a multilayer printed circuit board by blanking the integrated circuit chip and a portion of its lead from the lead frame and the film segment to which each frame is attached. The outer lead bonding sites of the leads are formed to produce a foot at the free end of the lead. The outer surface of each such foot of a lead is the lead's outer lead bonding site which foot is formed so that its outer lead bonding site is substantially parallel to the active face of the integrated circuit chip but displaced so as to be substantially aligned with the bottom surface, or back face, of the chip. The back face of the integrated circuit chip is metallized so that the back face can be soldered to a metallized chip site on the surface of the substrate simultaneously with the bonding of the outer lead sites of the leads of the chip to outer lead pads of the substrate.

Mounting an integrated circuit chip on a substrate with the active face of the chip encapsulated in a thermosetting plastic which is positioned between the chip and the chip pad of the substrate protects the active face of the chip and the inner lead bonds between the inner lead bonding sites and the input and output terminals of the chip from chemical and physical attack, as well as increasing the mechanical strengths of the inner lead bonds. The thermal conductivity of the thermosetting plastic is improved significantly by including in the thermoplastic material a material that is thermally conductive but electrically a good insulator, such as alumina $Al_2O_3$, or beryllium oxide BeO. The so-called flip chip approach to mounting chips on a printed circuit board, however, is not without problems, one of which is dissipating the heat that a chip will produce, the total amount of which, particularly for bipolar integrated circuit devices, tends to increase as the degree of integration increases, so as to maintain the temperature of each integrated circuit chip within its designed operating limits.

SUMMARY OF THE INVENTION

The present invention provides an integrated circuit chip package in which is incorporated improved means for cooling the chip. The integrated circuit chip has an active face on which is positioned a plurality of input and output terminals. A plurality of flexible beam leads, with each lead having an inner and an outer lead bonding site, has the inner lead bonding sites of each lead bonded to an input and output terminal on the active face of the chip. The chip is mounted on a chip pad on the top surface of a substrate, around which a plurality of outer lead pads is positioned. On the back face of the substrate a heat sink pad is located. The position of the heat sink pad on the substrate is substantially directly opposite that of the chip pad. At least one thermal passage is formed through the substrate to interconnect the chip pad and the heat sink pad on opposite sides thereof. The passage is filled with a good thermally conductive material, and a heat sink is bonded to the heat sink pad. The chip pad, heat sink pad, and the heat sink are all made of a good thermal conductor, such as copper, aluminum, or the like. A segment of fiber glass mesh which is coated with a thermosetting plastic which plastic is a good thermal conductor constitutes a preform, the size of which substantially conforms to that of the chip pad, and the preform is positioned on the chip pad. The integrated circuit chip is secured to the chip pad with the active face of the integrated circuit chip and a portion of each lead proximate the chip being encapsulated in the thermosetting plastic of the preform and with the outer lead bonding sites of the leads of the chip being bonded respectively to the outer lead pads. Compression bonding the outer lead bonding sites of the leads to the outer lead pads of the substrate places the leads in compression and causes the exposed portion of each lead to bend away from the top surface of the substrate.

It is, therefore, an object of this invention to provide an integrated circuit package, the manufacture of which can be automated so that the package can be produced at lower cost.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which.

DESCRIPTION OF THE INVENTION

Figure 1:
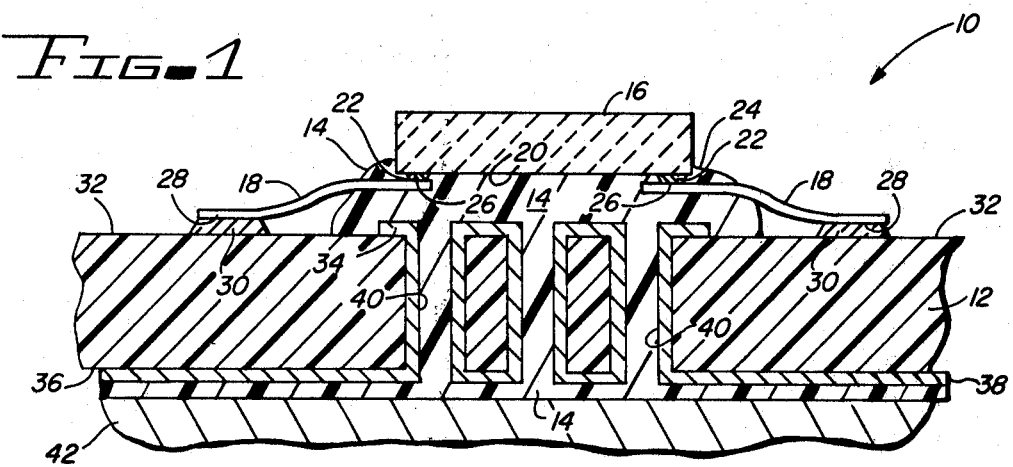
FIG. 1 is a cross section of an integrated circuit package illustrating one embodiment of the invention and FIG. 2 is a cross section of an integrated circuit package of a second embodiment of the invention.

Referring to FIG. 1, package 10 comprises a substrate 12, a preform 14, and an integrated circuit chip, or die, 16. Integrated circuit chip 16 is provided with a plurality of flexible beam leads 18, the number of leads 18 of a chip 16 varies as a function of the number of gates, the complexity or the degree of integration of chip 16, and ranges from 20-400 leads per chip, for example, for chips that are being produced at the present time, with the maximum number of leads per chip tending to increase with time. Integrated circuit chip 16 has a front, or active, face 20 with a plurality of input and output terminals, or bumps, 22, which is made of a good electrical conductor, such as gold or copper, for example. Input and output terminals 22 are commonly located near the outer perimeter 24 of active face 20.

Each flexible beam lead 18 is provided with an inner lead bonding site 26 and an outer lead bonding site 28. Beam leads 18 are made of a good electrical conductor, such as copper by a photolithographic technique, from a thin layer of copper foil which has been bonded or laminated to a segment of a strip of film. Prior to an integrated circuit chip 16 being mounted on substrate 12, leads 18 are bonded to the input and output terminals 22 on active face 20 with the inner lead bonding site 26 of each lead 18 being bonded by conventional thermocompression processes, or soldering, to an input and output terminal 22. The bond, the electrical and mechanical connection, between an input and output terminal 22 and an inner lead bonding site 26 of lead 18 is defined as an inner lead bond. The bond, or electrical and mechanical connection, between an outer lead pad 30 and an outer lead bonding site 28 of a lead 18 is defined as an outer lead bond. Substrate 12 is preferably a multilayer printed circuit board having multiple lamina of a glass fiber filled plastic material on which electrically conductive runs are photolithographically produced. Alternatively, substrate 12 could be a multilayer substrate having an alumina base and a plurality of alternating layers of electrical conductors and dielectric layers. With an alumina base the conductor layers and dielectric layers are conventionally screen printed onto the base of the substrate or onto the immediately previously formed layer. The top surface 32 of substrate 12 has formed on it a chip site or chip pad 34. Associated with chip pad 34 is a plurality of outer lead pads 30 which are positioned around the perimeter of chip pad 34. Outer lead pads 30 are made of a good electrical conductor, such as gold or copper, in the preferred embodiment. The material from which chip pad 34 is made is preferably a good thermal conductor, gold, copper, or aluminum, for example, to aid in dissipating heat produced by integrated circuit chip 16 which is mounted on pad 34.

Preform 14 is a small segment of a web of fiber glass, each of which segments has been coated with a suitable thermosetting plastic resin, such as a B-stage epoxy. In the preferred embodiment, the web is made of one-mil diameter glass fiber filaments. Sheets of the material from which the preform 14 is cut, or formed, are commercially available from Ablestik Laboratories of Gardena, Calif., under the trade name Able Film 550K. Preform 14 is sized so that it is substantially equal to, congruent with, chip pad 34 on which it is placed, or positioned. In the preferred embodiment, preform 14 has a thickness in the range of from 3-5 mils.

On the back surface 36 of printed circuit board 12 a heat sink pad 38 is formed. Heat sink pad 38 is positioned so that it is substantially opposite chip pad 34. A plurality of thermal conduits, or thermal passages, 40 is formed through substrate 12 to interconnect chip pad 34 with heat sink pad 38. Typically, each passage is provided with a plated copper lining. In the preferred embodiment, five thermal passages 40 are provided or formed through substrate 12. Bonded to heat sink pad 38 is a heat sink 42 of a good thermal conductor, such as copper, aluminum, or the like. Heat sink pad 38 and the heat sink 42 are made so that they are substantially equal in area, or heat sink 42 substantially coincides with and covers heat sink pad 38 when positioned thereon. In the embodiment illustrated in FIG. 1, heat sink 42, which is partially broken away, is bonded to heat sink pad 38 by a thermally conductive plastic material which preferably is substantially the same type of material as the epoxy material of preform 14. A thin layer of the epoxy bonding material is placed between heat sink 42 and heat sink pad 38. Substrate 12 is heated to a temperature of substantially 180° C. for substantially 30 minutes to finally cure the epoxy. During the process, the epoxy substantially fills the thermal conduits, or passages, 40 and secures heat sink 42 to the heat sink pad 38. Heat sink 42 is normally secured to the heat sink pad 38 and passages 40 filled with a suitable thermally conductive material prior to chip 16 being mounted on pad 34.

In producing integrated circuit package 10, it is preferable to mount heat sink 42 on heat sink pad 38 as the initial step in the process of fabricating package 10. A thin sheet of B-stage epoxy without a web of fiber glass filaments is cut to a size approximating that of heat sink pad 38 and heat sink 42. Substrate 12 is heated to a temperature in the range of from 110°-120° C., at which temperature the thermosetting plastic material is tacky so that it will adhere to pad 38 when brought in contact with it. Heat sink 42 is placed in contact with the tacky thermosetting plastic material to which the heat sink 42 will also adhere. Substrate 12 with heat sink 42 attached is then heated to a temperature of substantially 170° for approximately 20 minutes to partially cure the B-stage epoxy. During the partial curing step, heat sink 42 is positioned so that it substantially directly overlies heat sink pad 38, which reduces the thermal impedance between them, and the thermosetting plastic material flows into and substantially fills thermal passages 40 in substrate 30. Partial curing of the epoxy also prevents bubbles from being produced in the material, which is frequently the case if the substrate is heated immediately to a final curing temperature of substantially 180° C. The presence of bubbles in the thermosetting plastic material is obviously not desirable since their presence increases the thermal impedance of the material. After the partial curing of the thermoplastic material has been accomplished, there are then two courses of action with respect to bonding heat sink 42 to the heat sink pad 36 using a thermally conductive thermoplastic material. One course of action is to wait and conduct the final cure of the epoxy binding heat sink 42 to heat sink pad 38 at the same time that the epoxy of preform 14 bonding chip 16 to chip pad 34. The other is to finally cure the epoxy bonding heat sink 42 to pad 34 before mounting I.C. chip 16 on pad 34.

Prior to placing preform 14 on chip pad 34 of substrate 12, substrate 12 is preheated to a temperature in the range of from 110° to 120° C., at which temperature the thermosetting plastic material coating preform 14 becomes tacky so that it will adhere to the chip pad 34 on which it is placed. Chip 16 is next placed on preform 14, with its active face 20 down or in contact with preform 14 and is pushed into the preform with a force in the range of from 25 to 50 grams to initiate encapsulation of active face 20 and the portions of leads 18 near or proximate chip 16 in the thermosetting plastic of preform 14. The presence of the glass filaments of the web of preform 14 minimizes the possibility that the active face 20 of chip 16 will be forced into electrical, or mechanical, contact with the chip site 34 on which it is mounted, which could cause electrical shorts between the active face 20 of chip 16 or between chip face 20 and substrate 12. Substrate 12 is then preheated to a temperature to partially cure the thermosetting plastic material of the preform to encapsulate the front face 20 as well as to bond chip 16 to chip site 34 and to cause the thermosetting plastic material to flow into any unoccupied portion of the thermal conductive passages 40 to make good low thermal impedance contact with the plastic material substantially filling them. While the viscosity of the thermosetting plastic is still sufficiently low, chip 16 is positioned so that the outer lead bonding site 28 of each flexible beam lead 18 will substantially overlie the outer lead pad 30 to which it is to be bonded. While the thermosetting plastic material of preform 14 is being partially cured, it will flow around the inner portions of the leads 18 between the active face 20 of each chip 16 with the result that the leads 18 will be physically isolated, or separated, from the outer edge or perimeter 24 of chip 16. Since the thermosetting plastic material of preform 14 is a good electrical insulator, its presence between the leads 18 and the front face 20 of chip 16 prevents edge shorts.

The outer lead bonding sites 28 of each lead 18 of chip 16 are preferably bonded to their corresponding outer lead pad 30 by the application of heat and pressure, thermocompression bonding, using a suitable tool as is well known in the art. Typically, the outer lead bonding sites 28 have been pretinned with a solder compatible with the metal from which the outer lead pads 30 are fabricated so that when the assembly is heated slightly above the temperature at which the solder melts, or reflows, a good solder bond is formed between outer lead bonding site 28 of a lead 18 and the outer lead pad 30 to which it is bonded. Thermocompression bonding of leads 18 to their corresponding outer lead pads 30 places leads 18 under slight compression which in turn causes the exposed portions of leads 18 to be slightly curved, or bent, away from the surface 32 of substrate 12. After the outer lead bonding sites 28 of leads 18 are bonded to outer lead pads 30, package 10 is heated to a temperature of 180° C. for substantially 30 minutes, which causes the thermosetting plastic of preform 14 to become completely, or finally, cured. The plastic material of preform 14 which is the same material as that used to bond heat sink 42 to heat sink pad 38 and to fill conduits 40 is made a thermal conductor by loading, or mixing, with the thermosetting plastic, a good thermal conductor which is not a good electrical conductor, such as powdered alumina or beryllium oxide, as is well known in the art.

Figure 2:
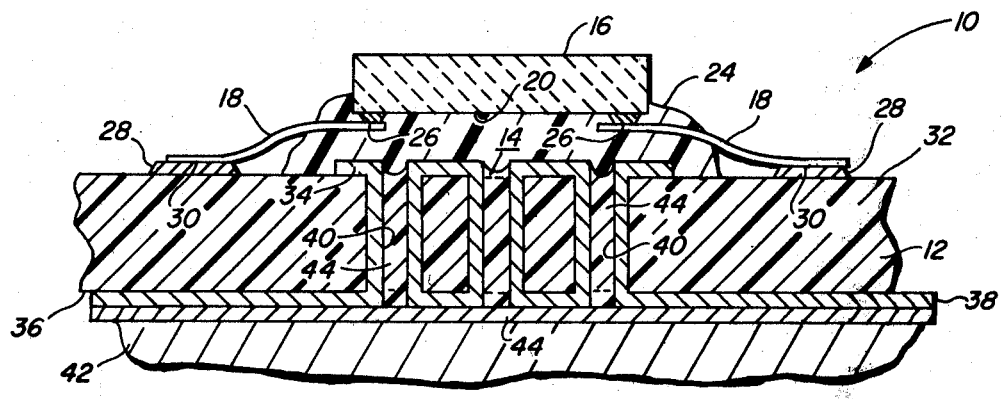

Referring to FIG. 2, thermal passages 40 interconnecting the chip pad 34 and the heat sink pad 38 are copper plated. Heat sink 42 is soldered to chip pad 38 by placing a thin sheet of a tin/lead solder, for example, between them. Substrate 10 is heated to a temperature at which solder 44 will reflow to bond or solder heat sink 42 to heat sink pad 38. Since solder 44 will wet the copper plating of passages 40, solder 44 will flow into and substantially fill thermal passages 40. The thermoplastic material of the preform 14 will, while being cured, flow into the upper portions of the passages 40 to make contact with the upper surfaces of solder 44 filling the passages 40 to minimize the thermal impedance between them. In other respects, the embodiment of FIG. 2 is substantially the same as that of the embodiment of FIG. 1. The method of mounting a chip 16 on a chip pad 34 is the same as that described with respect to FIG. 1. Alternatively, thermal passages 40 can be filled with copper so that each passage 40 will be essentially all copper.

From the foregoing, it is believed that the integrated circuit chip package of this invention provides a path having minimal thermal impedance from chip face 20 of chip 16 to heat sink 42 so that the ability of package 10 to dissipate heat produced by chip 16 is maximized.

What is claimed is:
1. An integrated circuit package comprising:
a substrate having a top surface and a bottom surface, a chip pad formed on the top surface, a plurality of outer lead pads associated with the chip pad, and a heat sink pad formed on the bottom surface of the substrate substantially opposite the chip pad;
means forming a thermal passage through the substrate interconnecting the chip pad with the heat sink pad;
a thermal conductive material substantially filling the thermal passage;
an integrated circuit chip having an active face and a plurality of input and output terminals located on the active face;
a plurality of flexible beam leads, each lead having an inner and an outer lead bonding site, the inner lead bonding site of each lead being bonded respectively to an input and output terminal of the integrated circuit chip;
an electrically insulating thermally conductive thermosetting plastic preform positioned on and substantially covering the chip pad, said integrated circuit chip being positioned on the preform with its active face and the portions of the leads proximate the input and output terminals of the chip being encapsulated in the plastic material of the preform, said plastic material also being located between the leads and the outer edges of the face of the chip;
the outer lead bonding site of each of the leads being bonded respectively to an input and output pad associated with the chip pad on which the integrated circuit chip is mounted; and
a heat sink bonded to the heat sink pad.
2. The integrated circuit package of claim 1 in which the chip pad and the heat sink pad are formed of a thermally conductive metal.
3. The integrated circuit package of claim 2 in which a plurality of thermal passages are formed through the substrate with each passage interconnecting the chip pad with the heat sink pad.
4. The integrated circuit package of claim 3 in which the thermal conductive material substantially filling the thermal passages is a thermosetting plastic.
5. The integrated circuit package of claim 4 in which the heat sink is bonded to the heat sink pad by a thermally conductive thermosetting plastic.
6. The integrated circuit package of claim 4 in which the thermal conductive material substantially filling the thermal passages is a metal.
7. The integrated circuit package of claim 6 in which the thermally conductive metal is a tin/lead solder.
8. The integrated circuit package of claim 7 in which the heat sink is bonded to the heat sink pad by the tin/lead solder that substantially fills the thermal passages.
9. The combination comprising:
an integrated circuit chip having an active face and a plurality input and output terminals on said face;
a plurality of beam leads, each lead having an inner and an outer lead bonding site, each inner lead bonding site being bonded respectively to an input and output terminal of the integrated chip;

a printed circuit board having a top surface and a back surface, a chip pad formed on the top surface and a plurality of outer lead pads associated with the chip pad, a heat sink pad formed on the back surface of the substrate substantially opposite the chip pad, a plurality of thermal passages formed through the substrate between the chip pad and the heat sink pad, said passages being lined with a thermally conductive metal;

a thermally conductive material substantially filling the thermal passages to provide a low thermal impedance path between the chip pad and the heat sink pad;

an electrically insulating thermally conductive thermosetting plastic preform comprised of a plastic coated fiber glass mesh positioned on the chip pad, said integrated circuit chip being mounted on said preform with its active face and the portion of its leads proximate the input and output terminals of the chip being encapsulated in the plastic of the preform, said plastic also being positioned between the leads and the outer edges of the active face of the chip, the outer lead bonding sites of the leads being bonded respectively to outer lead pads of the substrate; and a heat sink bonded to the heat sink pad by the material substantially filling the thermal passages, said chip, outer lead, and heat sink pads being made of a thermally and electrically conductive material.

10. The combination of claim 9 in which the lining of the passages through the substrate is copper.

11. The combination of claim 10 in which the thermally conductive material substantially filling the thermal passages is a thermally conductive plastic composition.

12. The combination of claim 10 in which the thermally conductive plastic of the composition is a B-stage epoxy.

13. The combination of claim 12 in which the thermally and electrically conductive material forming the chip, OL and heat sink pads is copper.

14. The combination of claim 12 in which the thermally conductive material substantially filling the thermal passages is a solder.

15. The combination of claim 14 in which the solder is a tin and lead solder.

* * * * *